United States Patent
Yamakawa et al.

(10) Patent No.: US 6,720,083 B2
(45) Date of Patent: Apr. 13, 2004

(54) ADHESIVE AND SEMICONDUCTOR DEVICES

(75) Inventors: Kimio Yamakawa, Chiba Prefecture (JP); Minoru Isshiki, Chiba Prefecture (JP); Katsutoshi Mine, Chiba Prefecture (JP)

(73) Assignee: Dow Corning Toray Silicone Co., Ltd., Tokyo (JP)

(*) Notice: Subject to any disclaimer, the term of this patent is extended or adjusted under 35 U.S.C. 154(b) by 0 days.

(21) Appl. No.: 10/103,456

(22) Filed: Mar. 20, 2002

(65) Prior Publication Data

US 2002/0142177 A1 Oct. 3, 2002

Related U.S. Application Data

(62) Division of application No. 09/597,061, filed on Jun. 20, 2000, now Pat. No. 6,410,642.

(30) Foreign Application Priority Data

Jul. 8, 1999 (JP) ............................................ 11-193828

(51) Int. Cl.[7] .............................................. B32B 25/20
(52) U.S. Cl. ...................... 428/447; 428/413; 524/80; 524/847; 524/492; 524/437; 524/441; 524/404; 524/413; 524/261; 524/424; 524/588; 524/612; 524/401; 528/31

(58) Field of Search .................................. 428/447, 413; 524/80, 847, 452, 437, 441, 404, 413, 261, 424, 588, 612, 401; 528/31

(56) References Cited

U.S. PATENT DOCUMENTS 5,863,970 A * 1/1999 Ghoshal et al.

FOREIGN PATENT DOCUMENTS

EP 0 432 502 B1 11/1990

OTHER PUBLICATIONS

JP 07–292343, Nov. 7, 1995, Japan (abstract only).
JP 07–014859, Jan. 7, 1995, Japan (abstract only).

* cited by examiner

*Primary Examiner*—Kuo-Liang Peng
(74) *Attorney, Agent, or Firm*—Catherine U. Brown

(57) ABSTRACT

An adhesive composition for bonding of semiconductor chips to their chip mounting components comprising a curable polymer composition that comprises a spherical filler having an average particle size from greater than 100 to 1,000 $\mu$m and an aspect ratio of 1 to 1.5. Semiconductor devices according to this invention are characterized in that a semiconductor chip therein is bonded to the mounting component for said chip by the aforementioned adhesive.

11 Claims, 1 Drawing Sheet

ADHESIVE AND SEMICONDUCTOR DEVICES

CROSS REFERENCE

This application is a divisional application claiming priority under 35 U.S.C. §120 to U.S. patent application Ser. No. 09/597,061 filed on Jun. 20, 2000, now U.S. Pat. No. 6,410,642.

BACKGROUND OF INVENTION

This invention relates to an adhesive for bonding semiconductor chips to their attachment members (hereinafter referred to as the chip mounting component) and to semiconductor devices in which a semiconductor chip therein is bonded to its chip mounting component by said adhesive. More particularly, this invention relates to an adhesive that can bond a semiconductor chip to its chip mounting component across a constant gap of adequate size and that can provide a thorough relaxation of the mechanical stresses acting on said chip. The invention additionally relates to highly reliable semiconductor devices.

Within the sphere of adhesives for bonding semiconductor chips to their chip mounting components, Japanese Laid Open (Kokai or Unexamined) Patent Application Number Hei 7-14859 (14,859/1995) teaches an adhesive that characteristically contains at least 5 weight % insulating powder consisting of at least 1 selection from inorganic insulators such as glasses, metal nitrides, and metal oxides that have a particle size of 50 to 100 $\mu$m. Japanese Laid Open (Kokai or Unexamined) Patent Application Number Hei 7-292343 (292,343/1995) teaches an adhesive comprising a platinum compound, spherical organic or inorganic filler having a particle size of 10 to 100 $\mu$m and a major axis-to-minor axis ratio (hereinafter referred to as the aspect ratio) of 1.0 to 1.5, an organosilicon compound containing silicon-bonded alkoxy, organopolysiloxane containing at least 2 silicon-bonded hydrogen in each molecule, and organopolysiloxane containing at least 2 silicon-bonded alkenyl in each molecule.

The adhesives taught in Japanese Laid Open (Kokai or Unexamined) Patent Application Numbers Hei 7-14859 and Hei 7-292343, however, have problems. It is quite difficult with these adhesives to obtain a large gap or space between the semiconductor chip and its chip mounting component and the size of the gap ends up being nonuniform even when a large gap can be generated. These adhesives are also unable to thoroughly relax the mechanical stresses acting on the semiconductor chip.

The inventors achieved the present invention as a result of intensive investigations into the problems described above. In specific terms, an object of this invention is to provide an adhesive that can bond a semiconductor chip to its chip mounting component across a uniform gap of adequate size and that can thoroughly relax the mechanical stresses acting on the semiconductor chip. Another object of this invention is to provide highly reliable semiconductor devices.

SUMMARY OF INVENTION

The present invention is an adhesive composition intended for the bonding of semiconductor chips to their chip mounting components and comprises a curable polymer composition that contains spherical filler that has an average particle size from greater than 100 to 1,000 $\mu$m and an aspect ratio of 1 to 1.5. Semiconductor devices according to this invention are characterized in that a semiconductor chip therein is bonded to the mounting component for said chip by the aforementioned adhesive.

Figure 1:
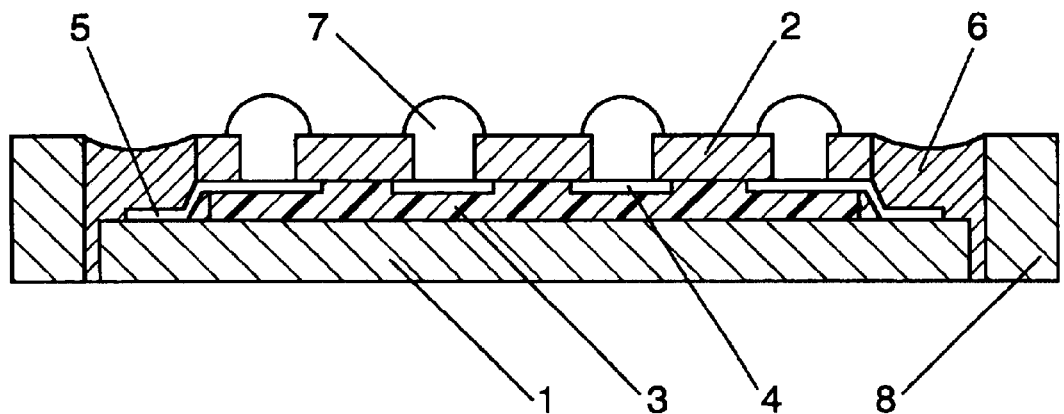
FIG. 1 contains the cross section of an integrated circuit that is an example of a semiconductor device according to the present invention.

| 1 | semiconductor chip |
| 2 | semiconductor chip mounting component |
| 3 | adhesive |
| 4 | conductor |
| 5 | lead |
| 6 | sealant/adhesive |
| 7 | solder ball |
| 8 | frame |
| 9 | bump |

DESCRIPTION OF INVENTION

The adhesive of this invention is intended for the bonding of semiconductor chips to their chip mounting components and comprises a curable polymer composition that contains spherical filler that has an average particle size from greater than 100 to 1,000 $\mu$m and an aspect ratio of 1 to 1.5. Semiconductor devices according to this invention are characterized in that a semiconductor chip therein is bonded to the mounting component.

The adhesive of this invention will be described in detail first. The spherical filler in this adhesive is the crucial component for achieving bonding between the semiconductor chip and its chip mounting component across a constant gap of adequate size. The average particle size of this spherical silica should be between greater than 100 and 1,000 $\mu$m (excluding 100 $\mu$m). The basis for this range is as follows. The production of a large gap between the semiconductor chip and its mounting component is highly problematic in the case of adhesive that uses spherical silica with an average particle size of 100 $\mu$m or less. Moreover, even when a large gap can be produced with such an adhesive, the gap will exhibit a tendency toward non-uniformity. At the other extreme, adhesive that uses spherical filler with an average particle size exceeding 1,000 $\mu$m produces a semiconductor chip-to-mounting component gap that is larger than necessary. The aspect ratio of the spherical filler under consideration should be within the range from 1 to 1.5 and is preferably from 1.0 to 1.1. It becomes increasingly difficult to generate a uniform chip-to-mounting component gap in the case of adhesive that uses spherical filler whose aspect ratio exceeds the given upper limit. In a particularly preferred embodiment, the standard deviation on the particle size distribution of the spherical filler does not exceed 10% of the average particle size of said filler.

The spherical filler under consideration is exemplified by inorganic spherical fillers composed of silica, glass, alumina, aluminosilicate, silicon nitride, boron nitride, silicon carbide, carbon, titanium oxide, aluminum, alumite, copper, silver, and stainless steel, and by organic spherical fillers composed of carbon, fluororesin, silicone resin, silicone rubber, epoxy resin, polyimide resin, polyphenylene sulfide resin, and polyetherketone resin. The spherical filler can be hollow or can be porous with pores on the surface and/or in the interior. Inorganic spherical fillers are preferred.

In a preferred embodiment of the invention, the spherical filler comprises 1 weight-ppm (part per million) to 5 weight % of the curable polymer composition. The preferred range is 1 weight-ppm to 2 weight % and the particularly preferred range is 1 weight-ppm to 1 weight %. It becomes increasingly difficult to obtain a constant chip-to-mounting component gap when the spherical filler content in the adhesive falls below the above-specified lower limit. At the other extreme, an inability to thoroughly relax the mechanical stresses acting on the semiconductor chip becomes increasingly prominent when the above-specified upper limit is exceeded. In addition, in a preferred embodiment, the spherical filler is present in the adhesive in an amount that avoids a stacking or superposition of neighboring spherical filler particles one above the other in the space between the semiconductor chip and its mounting component. For example, the spherical filler is preferably present in an amount such that the spherical filler particle count per the coated area is at least 3 and no more than {coated area/(particle size of the spherical filler)$^2$}×0.9. When the spherical filler content in the adhesive provides a spherical filler particle count per the coated area of less than 3, or more than {coated area/(particle size of the spherical filler)$^2$}×0.9 particles of the spherical filler in which case the particles will overlap each other, and it will become increasingly difficult to obtain a uniform gap between the semiconductor chip and its mounting component.

The curable polymer composition used in the present adhesive composition is exemplified by curable epoxy resin compositions, curable silicone compositions, curable acrylic resin compositions, and curable polyimide resin compositions. The curable epoxy resin compositions are exemplified by curable epoxy resin compositions and curable silicone-modified epoxy resin compositions; the curable silicone compositions are exemplified by curable silicone compositions, curable epoxy-modified silicone compositions, curable acrylic-modified silicone compositions, and curable polyimide-modified silicone compositions; the curable acrylic resin compositions are exemplified by curable acrylic resin compositions and curable silicone-modified acrylic resin compositions; and the curable polyimide resin compositions are exemplified by curable polyimide resin compositions and curable silicone-modified polyimide resin compositions. Curable epoxy resin compositions and curable silicone compositions are preferred. In a particularly preferred embodiment, the curable polymer composition is a curable silicone composition due to the ability of curable silicone compositions to thoroughly relax the mechanical stresses acting on semiconductor chips and also due to the excellent heat resistance of curable silicone compositions. The curable silicone compositions are exemplified by those curable by condensation reactions, those curable by addition reaction, those curable by ultraviolet radiation, and those curable by organoperoxide-mediated radical reactions, with addition reaction-curable silicone compositions being preferred. Said addition reaction-curable silicone compositions can comprise, for example, (A) organopolysiloxane having at least 2 alkenyl groups in each molecule, (B) organopolysiloxane having at least 2 silicon-bonded hydrogen atoms in each molecule, (C) an organosilicon compound having Si-bonded alkoxy, and (D) a platinum catalyst.

The organopolysiloxane (A), which is the base component in such an addition reaction-curable silicone composition, must contain at least 2 alkenyl groups in each molecule. This alkenyl is exemplified by vinyl, allyl, butenyl, pentenyl, hexenyl, and heptenyl with vinyl being preferred. The non-alkenyl silicon-bonded groups in (A) are exemplified by monovalent hydrocarbon groups excluding alkenyl, for example, alkyl groups such as methyl, ethyl, propyl, butyl, pentyl, hexyl, heptyl, and octyl; aryl groups such as phenyl, tolyl, and xylyl; aralkyl groups such as benzyl and phenethyl; and halogenated alkyl groups such as 3-chloropropyl and 3,3,3-trifluoropropyl. Methyl and phenyl are preferred for the non-alkenyl silicon-bonded groups. The proportion of phenyl in the total silicon-bonded organic groups in (A) is preferably in the range of from 1 to 30 mole % because this affords a composition with excellent cold resistance. Component (A) can be, for example, a single polymer having a straight-chain, partially branched straight-chain, branched-chain, cyclic, or resin-like molecular structure or can be a mixture of polymers with such molecular structures. Component (A) preferably has a viscosity (25° C.) in the range from 10 to 1,000,000 mPa·s.

The organopolysiloxane (B) is a crosslinker for the composition under consideration and must contain at least 2 silicon-bonded hydrogen atoms in each molecule. The silicon-bonded groups in (B) other than hydrogen are exemplified by monovalent hydrocarbon groups, for example, alkyl groups such as methyl, ethyl, propyl, butyl, pentyl, hexyl, heptyl, and octyl; aryl groups such as phenyl, tolyl, and xylyl; aralkyl groups such as benzyl and phenethyl; and halogenated alkyl groups such as 3-chloropropyl and 3,3,3-trifluoropropyl. Methyl and phenyl are preferred for the non-hydrogen silicon-bonded groups. Component (B) can be, for example, a single polymer having a straight-chain, partially branched straight-chain, branched-chain, cyclic, or resin-like molecular structure or can be a mixture of polymers. Component (B) preferably has a viscosity (25° C.) in the range of from 1 to 10,000 mPa·s.

The present adhesive composition preferably contains component (B) in an amount that provides from 0.3 to 10 moles silicon-bonded hydrogen from (B) per mole alkenyl in (A). The composition will not undergo a satisfactory cure when the addition of component (B) provides less silicon-bonded hydrogen per mole alkenyl in (A) than the lower limit of the given range. When the addition of (B) provides more silicon-bonded hydrogen per mole alkenyl in (A) than the upper limit of the given range, the cured product will have diminished mechanical strength.

The organosilicon compound (C) functions to improve the adherence of the composition under consideration and must contain at least 1 silicon-bonded alkoxy group in the molecule and preferably contains at least 3 silicon-bonded alkoxy groups in the molecule. The alkoxy in (C) can be, for example, methoxy, ethoxy, propoxy, or butoxy with methoxy being preferred. The other silicon-bonded groups in (C) are exemplified by the hydrogen atom; the hydroxyl group; functional organic groups such as 3-glycidoxypropyl, 2-(3, 4-epoxycyclohexyl)ethyl, and 3-methacryloxypropyl; and monovalent hydrocarbon groups, for example, alkyl groups such as methyl, ethyl, propyl, butyl, pentyl, hexyl, heptyl, and octyl; alkenyl groups such as vinyl, allyl, butenyl, pentenyl, and hexenyl; aryl groups such as phenyl, tolyl, and xylyl; aralkyl groups such as benzyl and phenethyl; and halogenated alkyl groups such as 3-chloropropyl and 3,3,3-trifluoropropyl. Component (C) preferably contains the vinyl group, silicon-bonded hydrogen, or an epoxy-functional organic group such as 3-glycidoxypropyl or 2-(3, 4-epoxycyclohexyl)ethyl.

Component (C) is exemplified by 3-glycidoxypropyltrimethoxysilane; 3-glycidoxypropyltriethoxysilane; 2-(3,4- epoxycyclohexyl)ethyltrimethoxysilane; vinyltrimethoxysilane; organosiloxane oligomer whose molecule contains silicon-bonded alkoxy, SiH, and 3-glycidoxypropyl or 2-(3, 4-epoxycyclohexyl)ethyl; and organosiloxane oligomer whose molecule contains silicon-bonded alkoxy, silicon-bonded alkenyl, and 3-glycidoxypropyl or 2-(3,4-epoxycyclohexyl)ethyl.

The composition under consideration preferably contains from 0 to 20 weight parts component (C) per 100 weight parts component (A). A composition containing component (C) in excess of the upper limit of the given range will cure to give a cured product with diminished mechanical strength.

The platinum catalyst (D) is a catalyst for inducing the addition reaction-mediated cure of the present composition. Component (D) can be exemplified by platinum black, platinum supported on silica micropowder, platinum supported on active carbon, platinum supported on alumina powder, chloroplatinic acid, alcohol solutions of chloroplatinic acid, olefin complexes of platinum, alkenylsiloxane complexes of platinum, carbonyl complexes of platinum, and thermoplastic resin powder with an average particle size of 10 µm or less that contains one or more of the previously listed platinum catalysts. The thermoplastic resin in the last-named example can be, for example, polystyrene resin, nylon resin, polycarbonate resin, and silicone resin.

Component (D) should be added to the present composition in sufficient quantity to induce the cure of the composition. In specific terms, component (D) is preferably added to the composition in an amount that provides from 1 to 1,000 weight-ppm platinum metal.

The present composition preferably contains an addition-reaction inhibitor as an optional component. This addition-reaction inhibitor can be exemplified by alkyne alcohols such as 3-methyl-1-butyn-3-ol, 3,5-dimethyl-1-hexyn-3-ol, and 3-phenyl-1-butyn-3-ol; ene-yne compounds such as 3-methyl-3-penten-1-yne and 3,5-dimethyl-3-hexen-1-yne; and by 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. The composition preferably contains from 10 to 50,000 weight-ppm of the addition-reaction inhibitor.

The present adhesive composition can contain as an optional component an organic resin powder, metal powder, or inorganic powder, in each case with an average particle size no greater than 100 µm. Said organic resin powder can be composed of, for example, a fluororesin or silicone resin; said metal powder can be composed of, for example, silver, nickel, or copper; and said inorganic powder can be, for example, silica, titanium oxide, carbon black, alumina, quartz powder, and glass. More particularly, the present adhesive composition containing inorganic powder with a specific surface area of 50 to 500 m$^2$/g is thixotropic and inhibited from the sedimentation and separation of the previously described spherical filler. The present adhesive composition can also contain, for example, heat stabilizer, flame retardant, colorant, and organic solvent.

The present adhesive composition can take the form of, for example, a relatively low viscosity fluid, a relatively high viscosity fluid, a grease, or a paste. These forms can be applied using an ejector- or extruder-type device such as a dispenser. In addition, the adhesive can be applied in a sheet or film configuration by partially crosslinking the adhesive or, when the curable polymer composition takes the form of a hot-melt adhesive, by converting the composition to a sheet or film.

The present adhesive composition preferably cures to give a rubber or gel. The adhesive can be cured at room temperature or by heating. In the case of heating, it is preferably heated, for example, to 50 to 200° C. using a heating lamp, hot plate, heated block, or forced hot-air convection oven. Semiconductor devices according to this invention will now be considered in detail. The characteristic feature of a semiconductor device according to this invention is that a semiconductor chip therein is bonded to its chip mounting component by the hereinabove-described adhesive. The semiconductor device can be, for example, an integrated circuit, a large scale integrated circuit, or a very large scale integrated circuit. Semiconductor devices according to this invention will be explained in detail with reference to the drawings appended herewith. In the semiconductor device shown in FIG. 1, a semiconductor chip 1 is bonded to a semiconductor chip mounting component 2 (a chip carrier in FIG. 1) by adhesive 3. In this case the semiconductor chip 1 is bonded facing the semiconductor chip mounting component 2. Conductors 4 are formed on the surface of the semiconductor chip mounting component 2 that faces the semiconductor chip 1; these conductors 4 and the semiconductor chip 1 are electrically connected by leads 5. These leads 5 are sealed or packed, in their entirety or partially, by a sealant/filler 6. The semiconductor chip mounting component 2 in the semiconductor device shown in FIG. 1 has been provided with solder balls 7 to enable mounting of the semiconductor device on a substrate. The semiconductor device in FIG. 1 has also been provided with a frame 8 in order to protect the semiconductor chip 1 from external mechanical stresses. This frame 8 is an optional feature for semiconductor devices according to this invention.

Figure 2:
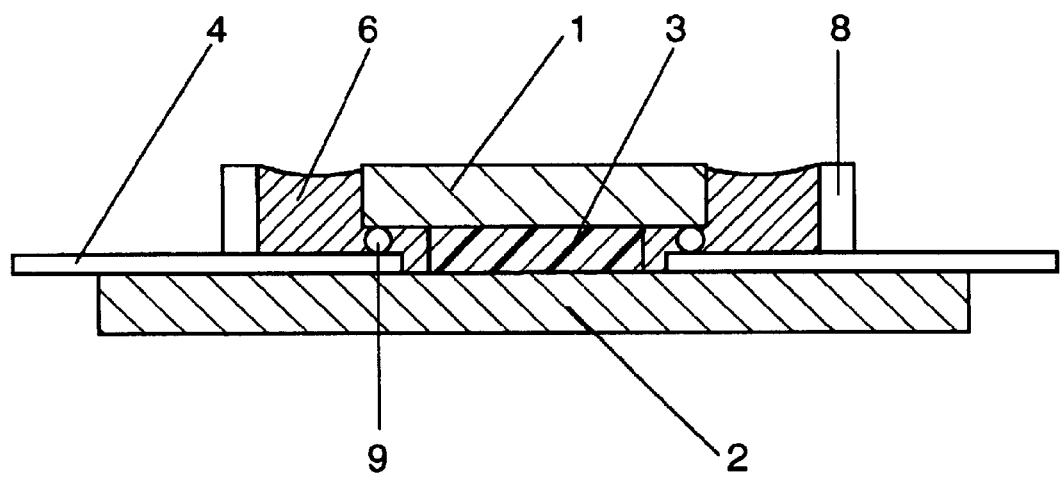
FIG. 2 contains the cross section of an integrated circuit that is also an example of a semiconductor device according to the present invention. Reference Numbers used in the drawings.

In the semiconductor device shown in FIG. 2, a semiconductor chip 1 is bonded to a semiconductor chip mounting component 2 (a circuit substrate in FIG. 2) by adhesive 3. In this case, again, the semiconductor chip 1 is bonded facing the semiconductor chip mounting component 2. Conductors 4 are formed on the surface of the semiconductor chip mounting component 2 that faces the semiconductor chip 1; these conductors 4 and the semiconductor chip 1 are electrically connected by bumps 9. These bumps 9 are sealed or packed, in their entirety or partially, by a sealant/filler 6. In order to mount the semiconductor device in FIG. 2 on a substrate, leads are provided that electrically connect with the conductors 4. Although not shown in FIG. 2, the semiconductor chip 1 may be sealed with a resin sealant.

Neither the type of semiconductor chip nor the semiconductor chip mounting component are critical for semiconductor devices of this invention. The semiconductor chip mounting component can be, for example, a ceramic-type chip mounting component, for example, alumina or glass; an organic resin-type chip mounting component, for example, epoxy resin, glass fiber-reinforced epoxy resin, polyimide resin, or bismaleimide triazine resin; or a metal-type chip mounting component, for example, stainless steel or copper, and can be, for example, a rigid circuit substrate or chip carrier or a flexible circuit substrate or chip carrier. The conductors can be formed on the surface or in the interior of the semiconductor chip mounting component by such means as printing, vapor deposition, gluing, lamination, and plating. Outer connecting terminals such as a ball grid (for example, solder balls) or pin grid and other electrical elements or components may also be provided or mounted. The component that electrically connects the semiconductor chip with the conductors of the semiconductor chip mounting component can be, for example, bonding wires, leads, or bumps. In order to relax the stresses acting on such components when the semiconductor device is subjected to thermal shock, in their bonding wire and lead implementations these components are preferably curved or bent and in their bump implementations are preferably made of a material with a small Young's modulus.

The use of a sealant/filler is preferred for the purpose of improving the reliability of semiconductor devices according to this invention. The sealant/filler can be exemplified by epoxy resin sealant/fillers such as epoxy resin sealant/fillers and silicone-modified epoxy resin sealant/fillers; silicone sealant/fillers such as silicone sealant/fillers, epoxy-modified silicone sealant/fillers, acrylic-modified silicone sealant/fillers, and polyimide-modified silicone sealant/fillers; acrylic resin sealant/fillers such as acrylic resin sealant/fillers and silicone-modified acrylic resin sealant/fillers; and polyimide resin sealant/fillers such as polyimide resin sealant/fillers and silicone-modified polyimide resin sealant/fillers. Silicone sealant/fillers are preferred. In order to effect sealing or packing of the component that electrically connects the semiconductor chip with the conductors on/in the corresponding chip mounting component, the sealant/filler is preferably a paste or liquid with liquids being particularly preferred. With regard to the procedure for sealing or packing the aforesaid electrically connecting component with the sealant/filler, the sealant/filler, for example, can be heated with a hot gas current or thermal radiation, or can be brought into contact with moisture, or can be exposed to ultraviolet radiation or an electron beam. In the case of semiconductor devices of this invention, a preferred approach for sealing or packing with the sealant/filler composition comprises the cure of a thermosetting sealant/filler by heating. This sealant/filler is preferably a sealant/filler that upon the application of heat thereto forms a cured product that is a gel or rubber at ambient temperature.

The particular process for fabricating semiconductor devices according to the present invention is not critical. As an example of a process by which the semiconductor device in FIG. 1 can be fabricated, the semiconductor chip 1 and the semiconductor chip mounting component 2 can first be attached together facing each other using the above-described adhesive; the adhesive can then be cured; and the semiconductor chip 1 and the conductors 4 of the semiconductor chip mounting component 2 can thereafter be electrically connected by the leads 5. This electrical connection can, however, also be effected prior to adhesive cure. In addition, these leads 5 can be sealed or packed, in their entirety or partially, with a sealant/filler and the sealant/filler can then be cured. As an example of a process by which the semiconductor device in FIG. 2 can be fabricated, the semiconductor chip 1 and the semiconductor chip mounting component 2 can first be attached together facing each other using the above-described adhesive; the adhesive can then be cured; and the semiconductor chip 1 and the conductors 4 of the semiconductor chip mounting component 2 can thereafter be electrically connected by the bumps 9. Again, this electrical connection can also be effected prior to adhesive cure. These bumps 9 can also be sealed or packed, in their entirety or partially, with a sealant/filler and the sealant/filler can then be cured. A frame can be used for the purpose of preventing sealant/adhesive outflow during this step. A metal or plastic frame can be used for this purpose, but the frame can also be formed from a curable, thixotropic liquid-form or grease-form organic resin composition. A frame having the form of a rubber or gel is particularly preferred.

EXAMPLES

The adhesive and semiconductor devices in accordance with the present invention are explained in greater detail below through working examples. The viscosity values reported in the examples were measured at 25° C. using a rotational viscometer (single cylinder geometry, Vismetron V from Shibaura System Co.). The procedure for fabricating the semiconductor devices and the evaluation methodologies are described below.

Semiconductor Device Fabrication

Semiconductor devices as shown in FIG. 1 were fabricated as follows. The adhesive was coated on a chip carrier and the semiconductor chip (area=50 mm$^2$) was applied onto the adhesive. The semiconductor chip was then bonded onto the chip carrier by curing for 30 minutes at 150° C. while pressing with a hot-press bonder. The semiconductor chip and the conductors formed on the chip carrier were subsequently electrically connected by leads. Finally, the leads were completely vacuum impregnated at 10 torr with a thermosetting silicone sealant/filler followed by cure of the sealant/filler by heating for 30 minutes at 150° C. Twenty semiconductor devices were fabricated by this procedure.

Measurement of the Film Thickness of the Adhesive Layer in the Semiconductor Devices The average thickness, minimum thickness, and maximum thickness of the adhesive layer were measured on 20 semiconductor devices by subtracting the thickness of the semiconductor chip and its mounting component (the thickness of the semiconductor chip and its mounting component were measured in advance) from the overall thickness of the semiconductor device.

Measurement of the Spherical Filler Count in the Adhesive Layer of the Semiconductor Devices The spherical filler particle count per the coated area was determined by inspecting the adhesive-coated side with a microscope.

Semiconductor Device Reliability Testing

Each semiconductor device was subjected to thermal cycle testing with one cycle consisting of holding for 30 minutes at −55° C. and holding for 30 minutes at +150° C. Using the terminals of the conductors on the semiconductor device, electrical continuity testing was carried out after 1,000 cycles and after 3,000 cycles. The defect rate was determined from the number of devices that exhibited defective continuity.

Example 1

An adhesive with a viscosity of 13,000 mPa·s was prepared by mixing the following to homogeneity: 100 weight parts dimethylvinylsiloxy-endblocked dimethylpolysiloxane with a viscosity of 10,000 mPa·s and a vinyl content of 0.12 weight %, 3 weight parts trimethylsiloxy-endblocked dimethylsiloxane-methylhydrogensiloxane copolymer with a viscosity of 20 mPa·s and a silicon-bonded hydrogen content of 0.7 weight %, 0.5 weight part dimethylhydroxysiloxy-endblocked methylvinylpolysiloxane with a viscosity of 20 mPa·s and a vinyl content of 31 weight %, 0.5 weight part 3-glycidoxypropyl-trimethoxysilane, 0.1 weight part of a 1 weight % isopropanolic chloroplatinic acid solution, 1 weight part of a spherical silica micropowder with an average particle size of 160 μm (standard deviation on the particle size distribution=5 μm) and an aspect ratio of 1.1, 0.01 weight part 3-phenyl-1-butyn-3-ol, and 2 weight parts fumed silica (average particle size=30 μm, BET specific surface area=200 m$^2$/g) whose surface had been treated with hexamethyldisilazane. When heated for 30 minutes at 150° C., this adhesive produced a silicone rubber that gave a value of 20 for the type A durometer specified in JIS K-6253. Semiconductor devices were fabricated using the adhesive, and the results of evaluation of these semiconductor devices are reported in Table 1.

Comparative Example 1

An adhesive with a viscosity of 12,000 mPa·s was prepared as in Example 1, but in this case omitting the spherical silica micropowder (average particle size=160 μm, standard deviation on the particle size distribution=5 μm, aspect ratio=1.1) that was used in Example 1. When heated for 30 minutes at 150° C., this adhesive produced a silicone rubber that gave a value of 20 for the type A durometer specified in JIS K-6253. Semiconductor devices were fabricated using the adhesive, and the results of evaluation of these semiconductor devices are reported in Table 1.

Comparative Example 2

An adhesive with a viscosity of 13,000 mPa·s was prepared as in Example 1, but in this case replacing the spherical silica micropowder (average particle size=160 μm, standard deviation on the particle size distribution=5 μm, aspect ratio=1.1) that was used in Example 1 with an equal amount of silica micropowder that had an average particle size of 160 μm, an aspect ratio of 2.0, and a standard deviation on the particle size distribution of 25 μm. When heated for 30 minutes at 150° C., this adhesive produced a silicone rubber that gave a value of 20 for the type A durometer specified in JIS K-6253. Semiconductor devices were fabricated using the adhesive, and the results of evaluation of these semiconductor devices are reported in Table 1.

Example 2

An adhesive with a viscosity of 21,000 mPa·s was prepared by mixing 100 weight parts of a thermosetting epoxy resin composition with a viscosity of 20,000 mPa·s (TXEP-100 from Dow Corning Toray Silicone Company, Limited, contained 50 weight % spherical silica powder with an average particle size of 2 μm and a maximum particle size of 8 μm) to homogeneity with 1 weight part spherical silica micropowder with an average particle size of 160 μm, aspect ratio of 1.05, and standard deviation on the particle size distribution of 3 μm. When heated for 2 hours at 150° C., this adhesive produced a cured epoxy resin that gave a value in excess of 95 for the type A durometer specified in JIS K-6253. Semiconductor devices were fabricated using the adhesive, and the results of evaluation of these semiconductor devices are reported in Table 1.

TABLE 1

|  | Example 1 | Example 2 | Comparative Example 1 | Comparative Example 2 |
|---|---|---|---|---|
| thickness of the adhesive layer (μm) | | | | |
| average value | 170 | 171 | 144 | 181 |
| maximum value | 174 | 174 | 156 | 202 |

TABLE 1-continued

|  | Example 1 | Example 2 | Comparative Example 1 | Comparative Example 2 |
|---|---|---|---|---|
| minimum value | 165 | 164 | 112 | 167 |
| spherical filler count | 17 | 16 | 0 | 16 |
| semiconductor device defect rate (%) | | | | |
| 1,000 cycles | 0 | 0 | 25 | 0 |
| 3,000 cycles | 0 | 0 | 60 | 10 |

We claim:

1. A device comprising a semiconductor chip bonded to an attachment member for the chip by an adhesive composition comprising a curable polymer composition comprising a spherical filler having an average particle size from greater than 100 to 1.000 μm and a major axis-to-minor ratio from 1 to 1.5, where the content of the spherical filler is 1 weight-ppm to 5 weight percent of the curable polymer composition.

2. The device of claim 1, where the curable polymer composition is a curable silicone composition.

3. The device of claim 1, where the curable polymer composition is a curable epoxy resin composition.

4. A device comprising a semiconductor chip bonded to an attachment member for the chip by an adhesive composition comprising a curable polymer composition comprising a spherical filler having an average particle size from greater than 100 to 1.000 μm and a major axis-to-minor axis ratio from 1 to 1.5, where the content of the spherical filler is 1 weight-ppm to 1 weight percent of the curable polymer composition.

5. A device comprising a semiconductor chip bonded to an attachment member for the chip by an adhesive composition comprising a curable polymer composition comprising a spherical filler having an average particle size from greater than 100 to 1,000 μm and a major axis-to-minor axis ratio from 1 to 1.5, and where the standard deviation for the particle size distribution of the filler does not exceed 10% of the average particle size of the spherical filler.

6. The device of claim 5, where the spherical filler has a major axis-to-minor axis ratio of from 1.0 to 1.1.

7. The device of claim 5, where the content of the spherical filler is from 1 weight-ppm to 5 weight % of the curable polymer composition.

8. The device of claim 5, where the spherical filler is an inorganic spherical filler.

9. The device of claim 5, where the curable polymer composition is a curable silicone composition.

10. The device of claim 5, where the curable polymer composition is a curable epoxy resin composition.

11. The device of claim 5, where the curable polymer composition is an addition reaction-curing silicone composition.

* * * * *